United States Patent
Tagawa et al.

[11] Patent Number: 5,410,243
[45] Date of Patent: Apr. 25, 1995

[54] THREE-PHASE COLLECTED TYPE OPTICAL CURRENT TRANSFORMER

[75] Inventors: Yosinori Tagawa; Tokio Yamagiwa; Genzi Takahashi, all of Hitachi; Akihiko Horide, Yokohama, all of Japan

[73] Assignees: Hitachi, Ltd.; Chubu Electric Power Co., Inc., both of Tokyo, Japan

[21] Appl. No.: 958,096

[22] Filed: Oct. 8, 1992

[30] Foreign Application Priority Data

Oct. 17, 1991 [JP] Japan .................................. 3-296536

[51] Int. Cl.⁶ .............................................. H01F 40/06
[52] U.S. Cl. ........................................ 323/358; 324/96; 324/107; 324/127
[58] Field of Search .................. 324/96, 107, 127; 323/358

[56] References Cited

U.S. PATENT DOCUMENTS

| | | | |
|---|---|---|---|
| 5,066,903 | 11/1991 | Ochi | 324/96 |
| 5,128,608 | 7/1992 | Ochi | 324/96 |

FOREIGN PATENT DOCUMENTS

| | | | |
|---|---|---|---|
| 4037737A1 | 11/1990 | Germany | G01R 15/07 |
| 59-155765 | 9/1984 | Japan | 324/96 |
| 1-136074 | 5/1989 | Japan | 324/96 |
| 2-69672 | 3/1990 | Japan | G01R 15/07 |
| 2-105068 | 4/1990 | Japan | 324/96 |

OTHER PUBLICATIONS

Optimum Arrangement of Three Phase Optical CT Sensors with a Circuital Light Path, 1991, Japan.
Patent Abstracts of Japan, vol. 7 No. 198 (P-220) [1343] Sep. 2, 1983-58-97663-Oct. 6, 1983.
Patent Abstracts of Japan, Vo. 7, No. 198 (P-220) [1343] Sep. 2, 1983-58 97662-Oct. 6, 1983.

*Primary Examiner*—Jeffrey L. Sterrett
*Attorney, Agent, or Firm*—Antonelli, Terry, Stout & Kraus

[57] ABSTRACT

A three-phase collected type optical current transformer having a common hermetically sealed container miniaturized in its radial direction. The common hermetically sealed container incorporating central conductors and optical current transformers corresponding to three phases has a branch tube or flange in its radial direction. The flange incorporates optical spacial transmission members for three phases which guide the signals sent from the optical current transformers through optical fibers to the exterior of the common hermetically container. The optical spatial transmission members are arranged collectively. The common hermetically sealed container, when it has a branching portion protruding in its radial direction at its end, incorporates no flange but a concentrated optical spacial transmission member for three phases at the end in the axial direction of the common hermetically sealed container having the branching member. Thus, the common hermetically sealed container can be simplified in its structure so as to be miniaturized in the radial direction.

13 Claims, 5 Drawing Sheets

THREE-PHASE COLLECTED TYPE OPTICAL CURRENT TRANSFORMER

BACKGROUND OF THE INVENTION

The present invention relates to a three-phase collected type optical current transformer in which the optical transformers corresponding to three phases are incorporated in a common hermetically sealed container miniaturized in its radial direction.

One of such previously known three-phase collected optical current transformers is disclosed in JP-A-H-2-69672. In this conventional transformer, three branch tubes or flanges which protrude from the common hermetically sealed container incorporating three-phase central conductors in its radial direction were used to construct the optical current transformer corresponding to each of three phases.

The conventional three-phase collected type optical current transformer constructed in the above manner has disadvantages that its design is complicated since the flanges corresponding to three phases must be formed in the common hermetically sealed container and the container is large-scaled in its radial direction due to the optical current transformer to be connected with each of the flanges.

SUMMARY OF THE INVENTION

A main object of the present invention is to provide a three-phase collected type optical current transformer with a common hermetically sealed container miniaturized in its radial direction.

Another object of the present invention is to provide a three-phase collected type optical transformer which is not affected by magnetic fields in other phases.

In order to attain the above objects, in accordance with the present invention, optical spacial transmission parts for three-phase optical current transformers are formed collectively in a common part formed in a common hermetically sealed container, e.g. a single flange formed in the radial direction, or at the end of the common hermetically sealed container in the axial direction.

In the three-phase collected type optical transformer according to the present invention having the above construction, the common part to be formed in the common hermetically sealed container can be constructed by e.g. a single flange so that the common hermetically sealed container can be formed in a simple design and also miniaturized in the radial direction as compared with the prior arts.

BRIEF DESCRIPTION OF THE DRAWINGS

Preferred embodiments of the present invention will now be described in conjunction with the accompanying drawings in which.

DESCRIPTION OF THE PREFERRED EMBODIMENTS

Embodiment 1

Figure 1:
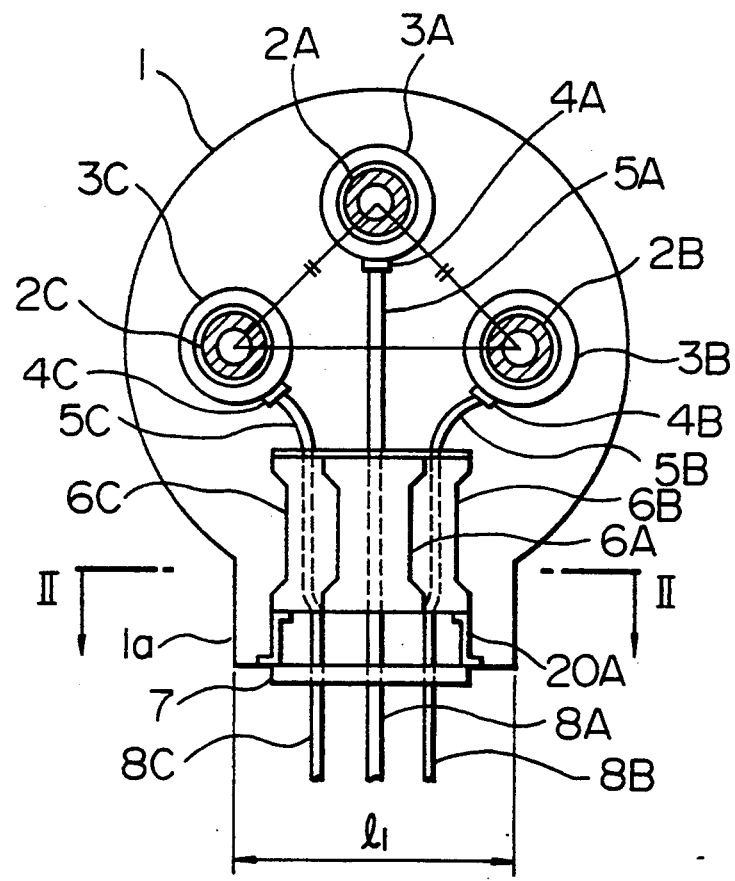
FIG. 1 is a sectional view of the three-phase collected type optical current transformer according to the first embodiment of the present invention.
Figure 2:
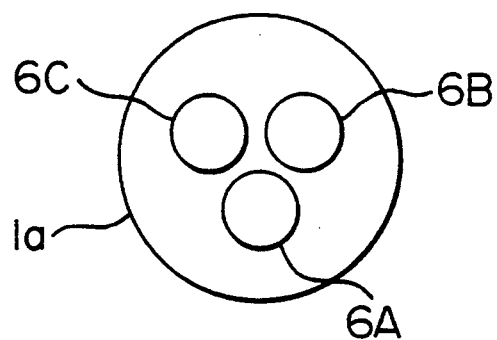
FIG. 2 is a sectional view taken on line II—II in FIG. 1.

FIG. 1 is a sectional view of the three-phase collected type optical current transformer according to the first embodiment of the present invention, and FIG. 2 is a sectional view taken on line II—II in FIG. 1.

In FIG. 1, central conductors 2A, 2B and 2C for three phases are located at positions of apices of a virtual isosceles triangle as shown within a cylindrical common hermetically sealed container 1 and are supported by insulating supporters (not shown) at suitable positions in the longitudinal direction. In the radial direction of the common hermetically sealed container, a plate-like flange 1a having a thickness of $l_1$ is formed. The lower ends of optical spacial transmission members 6A, 6B and 6C of epoxy resin are fixed to the lower inner face of the flange 1a through metal fittings 20A for each of individual phases or these three phases. These members corresponding to three phases are arranged collectively as shown in FIG. 2. Optical fibers 5A, 5B and 5C and 8A, 8B and 8C which are opposed to each other are arranged on the upper and lower ends of the optical spacial transmission members 6A, 6B and 6C, respectively. The latter optical fibers 8A, 8B and 8C are taken out so as to seal a member 7 for sealing the flange 1a and connected with a control device (not shown). The former optical fibers 5A, 5B and 5C are connected with the optical input/output ports 4A, 4B and 4C of the optical current transformers 3A, 3B and 3C (each of the optical input/output ports 4A, 4B and 4C is provided on the outer periphery of each of the corresponding central conductors 2A, 2B and 2C of the optical current transformers 3A, 3B and 3C).

Thus, in the first embodiment, the optical spacial transmission members 6A, 6B and 6C corresponding to three phases are arranged collectively as shown in FIG. 2 in the single flange extending in the radial direction of the common hermetically sealed container 1. So the common hermetically sealed container 1 can be formed in a simple design and also miniaturized. Further, since the flange 1a is formed in the direction opposite to the base of the virtual isosceles triangle on the apices of which the three phase central conductors 2A, 2B and 2C are located, there is no problem of isolation between the central conductors 2A, 2B and 2C and the optical spacial transmission members 6A, 6B and 6C. The opposing distance between the optical current transformers 3A, 3B and 3C and the optical spacial transmission members 6A, 6B and 6C are so long that the optical fibers 5A, 5B and 5C can be arranged easily.

Embodiment 2

Figure 3:
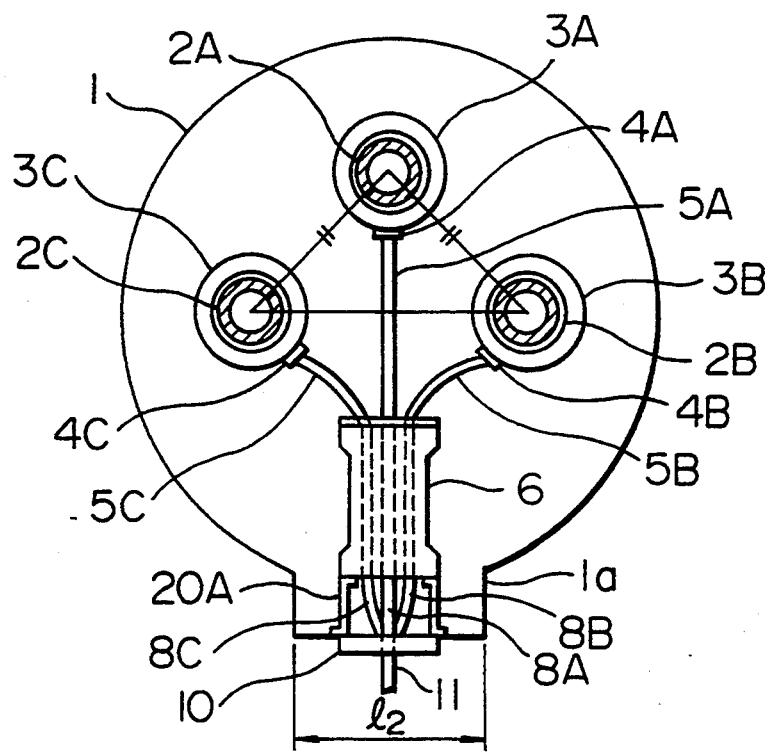
FIG. 3 is a sectional view of the three-phase collected type optical current transformer according to the second embodiment of the present invention.

FIG. 3 is a sectional view of the three-phase collected type optical current transformer according to the second embodiment of the present invention. In FIG. 3, like reference numerals refer to like elements in FIG. 1.

The optical spacial transmission member 6 according to the second embodiment is a three-phase collected type in which the optical spacial members 6A, 6B and 6C in FIG. 1 are collected into a single member within a single insulating cylinder. The optical transmission member is connected with optical fibers 5A, 5B and 5C corresponding to three phases in its upper end and connected with a concentrated optical fiber 11 collecting three phases in its lower end. The concentrated optical fiber 11 is taken out so as to penetrate through an optical sealing terminal 10 as it is sealed.

In this embodiment, the optical spacial transmission member 6 and the concentrated fiber 11 are adapted to collect three phases so that the diameter $l_2$ of the flange 1a formed in the common hermetically sealed container 1 can be made smaller than the diameter $l_1$ of the flange 1a in FIG. 1 ($l_2 < l_1$) thereby miniaturizing the three-phase collected type optical current transformer.

Embodiment 3

Figure 4:
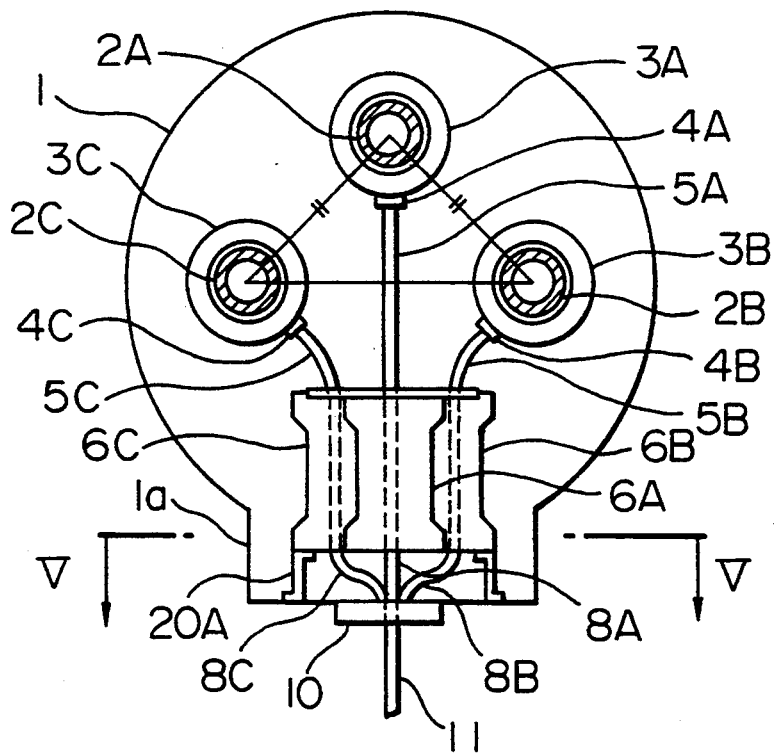
FIG. 4 is a sectional view of the three-phase collected type optical current transformer according to the third embodiment of the present invention.
Figure 5:
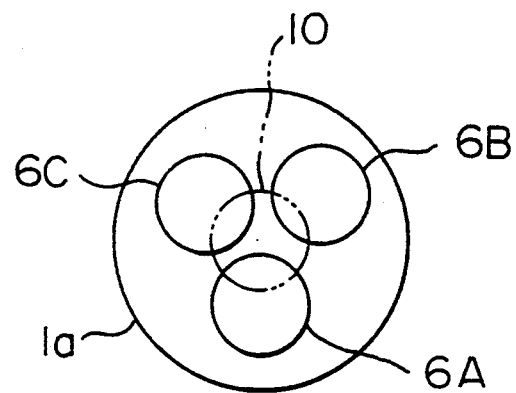
FIG. 5 is a sectional view taken on line V—V in FIG. 4.

FIG. 4 is a sectional view of the three-phase collected type optical current transformer according to the third embodiment of the present invention. FIG. 5 is a sectional view taken on line V—V in FIG. 4. This embodiment is different from the first embodiment in that the optical fibers 8A, 8B and 8C connected with the lower ends of optical spacial tranmission members 6A, 6B and 6C are collected into a single member which is taken out as a single concentrated optical fiber 11 through a three-phase collecting optical sealing terminal 10. The three-phase collecting optical sealing terminal 10 is centered substantially among the optical spacial transmission members 6A, 6B and 6C as seen from FIG. 5 which is a sectional view taken on line V—V in FIG. 4. In FIG. 4, other like reference numerals refer to like elements in FIG. 1.

In this embodiment also, the optical sealing terminal 10 can be miniaturized and the concentrated optical fiber 11 can be designed as a single member so that the optical fiber can be easily connected with a control device (not shown).

Embodiment 4

Figure 6:
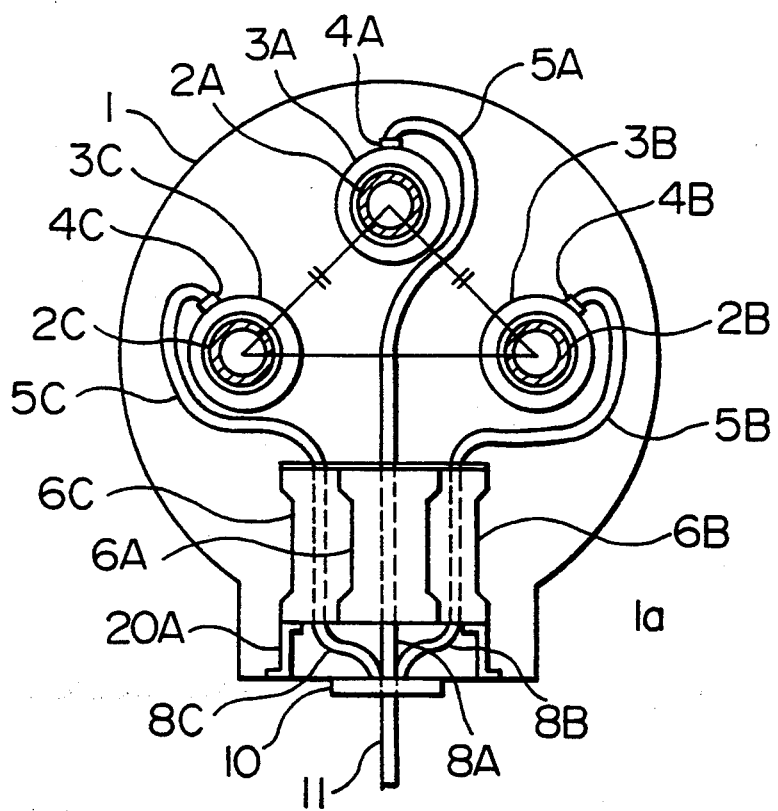
FIG. 6 is a sectional view of the three-phase collected type optical current transformer according to the fourth embodiment of the present invention.

FIG. 6 is a sectional view of the three-phase collected type optical current transformer according to the fourth embodiment of the present invention. An explanation will be given of only differences from the third embodiment shown in FIG. 4.

The feature of this embodiment resides in specific location of optical input/output ports 4A, 4B and 4C which are ports for connecting the optical current transformers 3A, 3B and 3C with the optical fibers 5A, 5B and 5C. Specifically, in the case of FIG. 4, the optical input/output ports 4A, 4B and 4C are located at the positions opposite to the optical spacial transmission members 6A, 6B and 6C, whereas in the case of FIG. 6, they are located at the positions not opposed to each other between the central conductors 2A, 2B and 2C for the respective phases.

In this way, the optical input/output ports 4A, 4B and 4C are located at the positions not opposed to each other between the adjacent central conductors so that a certain phase is not affected by the magnetic field in other phases, thereby enhancing the accuracy of the optical current transformers.

Embodiment 5

Figure 7:
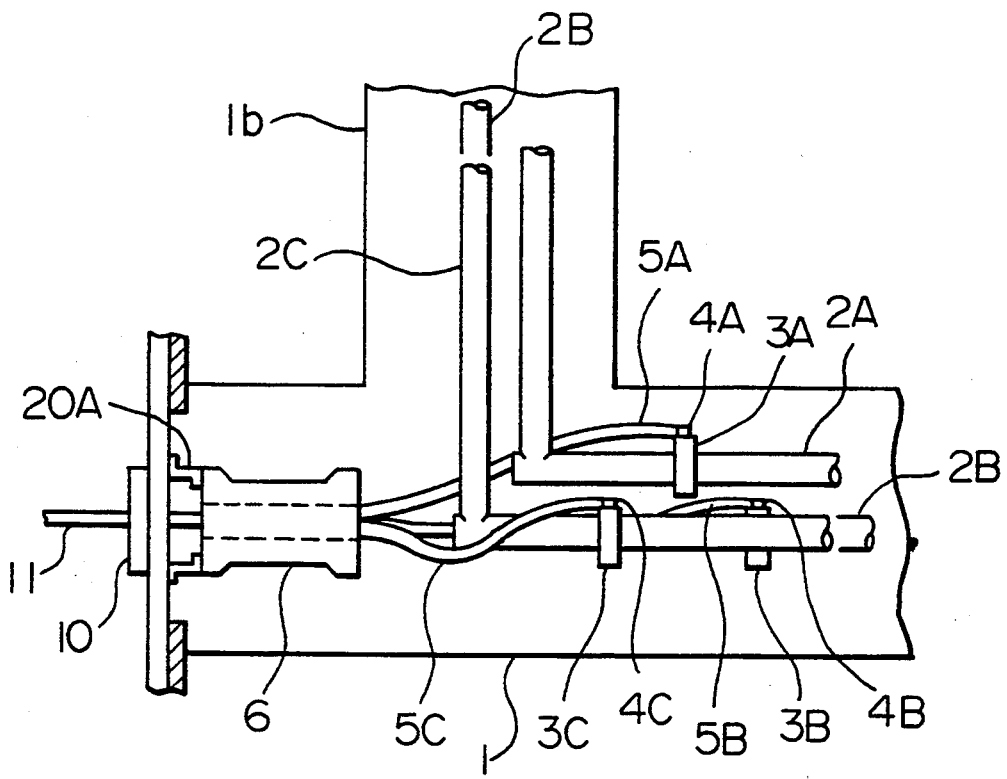
FIG. 7 is a sectional view of the three-phase collected type optical current transformer according to the fifth embodiment of the present invention.

FIG. 7 is a sectional view of the three-phase collected type optical current transformer according to the fifth embodiment of the present invention. In this embodiment, it should be noted that the optical transformer is located at the end of a main bus.

In FIG. 7, in the case where central conductors 2A, 2B and 2C arranged within a common hermetically sealed container 1 constitute the main bus, there are, at the end of the main bus, a branching port 1b extending in a direction perpendicular to the main bus and a space in the axial direction of the main bus. A concentrated optical spacial transmission member 6 is arranged in this space, and fixed, through metal fittings 20A, to the end cover 14 for sealing the end of the common hermetically sealed container 1 in the axial direction. The one ends of optical fibers 5A, 5B and 5C are connected with optical current transformers 3A, 3B and 3C through optical input/output members 4A, 4B and 4C whereas the other ends thereof are connected with the right end of the optical spacial transmission member 6 whose left end is connected with a three-phase collected type concentrated optical fiber 11. The concentrated optical fiber 11 is taken out hermetically through an optical sealing terminal 10. The respective current transformers are arranged at the positions displaced in the axial direction of the central conductors 2A, 2B and 2C.

In the above structure, the end of the main bus in the axial direction which was not used conventionally can be used positively to constitute a current transformer. Further, since the optical current transformers 3A, 3B and 3C are arranged at the positions displaced in the axial direction of the central conductors, the isolation among the central conductors can be made with a decreased diameter of the common hermetically sealed container 1 as compared with the case where these conductors are arranged at the same position.

Embodiments 6 and 7

Figure 8:
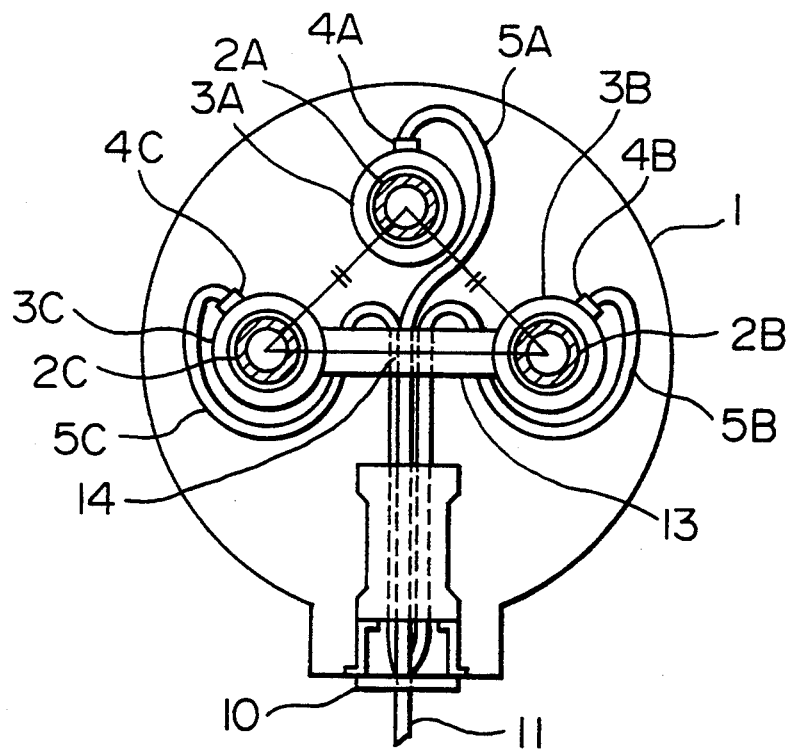
FIG. 8 is a sectional view of the three-phase collected type optical current transformer according to the sixth embodiment of the present invention.
Figure 9:
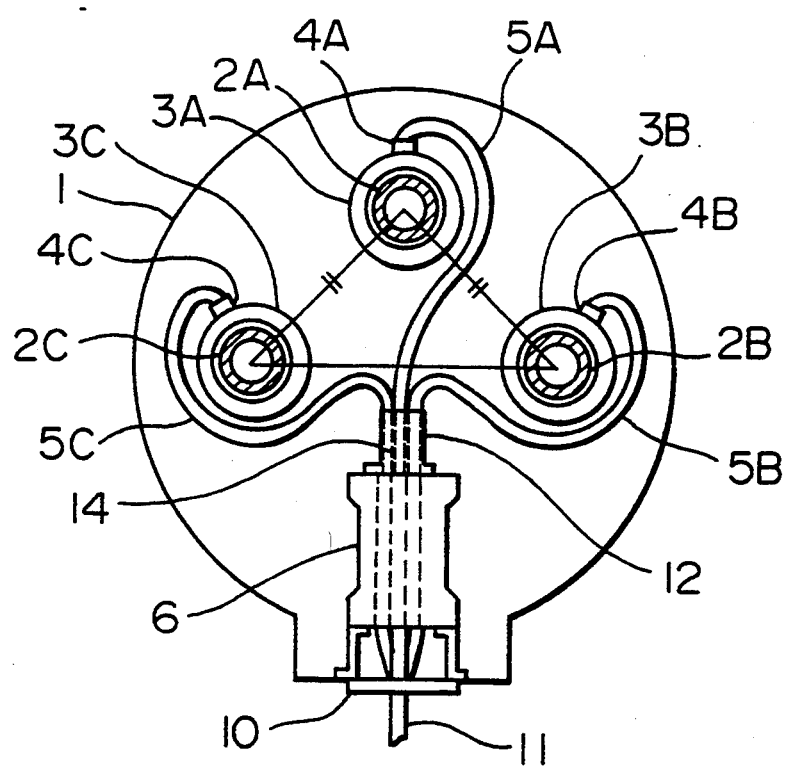
FIG. 9 is a sectional view of the three-phase collected type optical current transformer according to the seventh embodiment of the present invention.

FIG. 8 is a sectional view of the three-phase collected type optical current transformer according to the sixth embodiment of the present invention, and FIG. 9 is a sectional view of the three-phase collected type optical current transformer according to the seventh embodiment of the present invention. The feature of the sixth and seventh embodiments resides in the structure for supporting optical fibers 5A, 5B and 5C.

Specifically, since optical input/output ports 4A, 4B and 4C between optical current transformers 3A, 3B and 3C and optical fibers 5A, 5B and 5C are located at the positions not opposed between the central conductors 2A, 2B and 2C for respective phases, the optical fibers 5A, 5B and 5C are long relatively. In the sixth embodiment, as shown in FIG. 8, a first insulating supporter 13 whose ends are fixed to central conductors is provided to support the optical fibers 5A, 5B and 5C in such a manner that these optical fibers 5A, 5B and 5C are inserted in through-holes 14 formed in the first insulating supporter 13. In the seventh embodiment, as shown in FIG. 9, a second insulating supporter 12 attached to the upper end of an optical spacial transmission member 6 is provided to support the optical fibers 5A, 5B and 5C in such a manner that these optical fibers 5A, 5B and 5C are inserted in through-holes 14 formed in the second insulating supporter 12.

As described above, in the embodiments of the present invention, the optical spacial transmission member (6; 6A, 6B and 6C) corresponding to three phases is formed using the flange 1a or the end of the common hermetically sealed container 1 so that the common hermetically sealed container 1 can be miniaturized. Since the optical spacial transmission member (6; 6A, 6B and 6C) is constructed by an insulating cylinder whose one end is attached to the common hermetically sealed container 1, its other end can support the optical fibers 5A, 5B and 5C; it can easily support these fibers also when the optical input/output ports are arranged at the positions not opposed between adjacent central conductors so that a certain phase is not affected by the magnetic field in other phases.

In accordance with the present invention, a three-phase optical spacial transmission member(s) are arranged collectively in the flange formed in the common hermetically sealed container or its axial direction end so that the three-phase collected type optical current transformer can be formed in a miniaturized common hermetically sealed container.

Further, the present invention has also an advantage that if the optical input/output ports are arranged at the positions not opposed between the adjacent central conductors, a certain phase will not be affected by the magnetic field in other phases.

We claim:

1. A three-phase collected type optical current transformer comprising:
   a common hermetically sealed container;
   three-phase central conductors arranged within said common container;
   optical current transformers each arranged on the outer periphery of respective ones of said central conductors, optical fibers connected with respective ones of said transformers for simultaneously outputting signals from the respective transformers;
   a flange formed in the radial direction of said common hermetically sealed container; and
   an optical spacial transmission member for three phases arranged in said flange, said optical spacial transmission member serving to guide the signals sent from said optical current transformers through the corresponding optical fibers to the exterior of said container.

2. A three-phase collected type optical current transformer according to claim 1, wherein said optical current transformers for respective phases are arranged at the positions displaced in the axial direction of said central conductors.

3. A three-phase collected type optical current transformer according to claim 1, wherein said optical spacial transmission member is a three-phase collected type incorporating three phases in a single insulating cylinder.

4. A three-phase collected type optical current transformer comprising:
   a common hermetically sealed container extending in an axial direction and having a branching portion protruding in the radial direction at an end thereof;
   three-phase central conductors arranged within said container;
   optical current transformers each arranged on the periphery of each of said central conductors, optical fibers connected with respective ones of said transformers for outputting signals therefrom; and
   an optical spacial transmission member for three phases arranged at said end of said common container in its axial direction, said optical spacial transmission member serving to guide the signals sent from each of said optical current transformers through the corresponding optical fibers to the exterior of said common container;
   wherein said optical spacial transmission member has an insulating cylinder whose one end is fixed to said common hermetically sealed container, and wherein one end of each of said optical fibers is connected with a respective one of said current transformers through optical input/output ports thereof and the other end of each of said optical fibers is supported by the other end of said insulating cylinder of said spacial transmission member.

5. A three-phase collected type optical current transformer comprising:
   a common hermetically sealed container;
   three-phase central conductors arranged within said common container;
   optical current transformers each arranged on the periphery of each of said central conductors, optical fibers connected with respective ones of said transformers for outputting signals therefrom;
   a flange formed in the radial direction of said common hermetically sealed container; and
   an optical spacial transmission member for three phases arranged in said flange, said optical spacial transmission member serving to guide the signals sent from said optical current transformers through the corresponding optical fibers to the exterior of said container;
   wherein said three phase central conductors are located at the apices of a virtual isosceles triangle, and said flange is arranged at the position opposite to the base of said virtual isosceles triangle.

6. A three-phase collected type optical current transformer comprising:
   a common hermetically sealed container;
   three-phase central conductors arranged within said common container;
   optical current transformers each arranged on the periphery of each of said central conductors, optical fibers connected with respective ones of said transformers for outputting signals therefrom;
   a flange formed in the radial direction of said common hermetically sealed container; and
   an optical spacial transmission member for three phases arranged in said flange, said optical spacial transmission member serving to guide the signals sent from said optical current transformers through the corresponding optical fibers to the exterior of said container;
   wherein said optical spacial transmission member has an insulating cylinder whose one end is fixed to said common hermetically sealed container, and wherein one end of each of said optical fibers is connected with a respective one of said current transformers through optical input/output ports thereof and the other end of each of said optical fibers is supported by the other end of said insulating cylinder of said spacial transmission member.

7. A three-phase collected type optical current transformer according to claim 6, wherein said three phase central conductors are located respectively at an apex and right and left sides of the apex on a base of a virtual isosceles triangle, and when a first reference line is drawn to pass through the center of each of the current transformers at right and left sides of the apex, a second reference line is drawn to pass through the center of each of the current transformers at the apex and the right side of the apex, and a third reference line is drawn to pass through the center of each of the current transformers at the apex and the left side of the apex, an optical input/output port of the optical current transformer at the apex is disposed between extended portions of the second reference line and the third reference line which extend beyond an intersection thereof.

8. A three-phase collected type optical current transformer comprising:

a common hermetically sealed container;

three-phase central conductors arranged within said common container in a triangular shape;

optical current transformers of the type utilizing the Faraday effect and having a circuital light path, each of said optical current transformers being arranged on the periphery of each of said central conductors; and optical fibers for leading outputs of said optical current transformers to the exterior of said common container;

wherein said optical current transformers are arranged in the triangular shape with a first optical current transformer at the apex and second and third optical current transformers respectively at right side and left side of the apex on the base of the triangle, and an optical input/output port of said second optical current transformer and an optical input/output port of said third optical current transformer are disposed at positions shifted towards the first optical current transformer from a first reference line which passes the centers of said second and third optical current transformers.

9. A three-phase collected type optical current transformer comprising:

a common hermetically sealed container extending in an axial direction and having a branching portion protruding in the radial direction at an end thereof;

three-phase central conductors arranged within said container;

optical current transformers each arranged on the outer periphery of each of said central conductors, optical fibers connected with respective ones of said transformers for simultaneously outputting signals from the respective transformers; and an optical spacial transmission member for three phases arranged at said end of said common container in its axial direction, said optical spacial transmission member serving to guide the signals sent from each of said optical current transformers through the corresponding optical fibers to the exterior of said common container.

10. A three-phase collected type optical current transformer according to claim 9, wherein said optical spacial transmission member is a three-phase collected type incorporating three phases in a single insulating cylinder.

11. A three-phase collected type optical current transformer according to claim 9, wherein said optical current transformers for respective phases are arranged at the positions displaced in the axial direction of said central conductors.

12. A three-phase collected type optical current transformer comprising:

a common hermetically sealed container;

three-phase central conductors arranged within said common container;

optical current transformers each arranged on the periphery of each of said central conductors, optical fibers connected with respective ones of said transformers for outputting signals therefrom;

a flange formed in the radial direction of said common hermetically sealed container;

an optical spacial transmission member for three phases arranged in said flange, said optical spatial transmission member serving to guide the signals sent from said optical current transformers through the corresponding optical fibers to the exterior of said container, and said transformer further comprising a first insulating supporter whose both ends are fixed to two of said three phase central conductors, respectively, said first insulating supporter serving to support the optical fibers in such a manner that these optical fibers are inserted in plural through-holes formed in said insulating supporter.

13. A three-phase collected type optical current transformer comprising:

a common hermetically sealed container;

three-phase central conductors arranged within said common container;

optical current transformers each arranged on the periphery of each of said central conductors, optical fibers connected with respective ones of said transformers for outputting signals therefrom;

a flange formed in the radial direction of said common hermetically sealed container;

an optical spacial transmission member for three phases arranged in said flange, said optical spacial transmission member serving to guide the signals sent from said optical current transformers through the corresponding optical fibers to the exterior of said container, and said transformer further comprising a second insulating supporter attached to the upper end of said three-phase optical spacial transmission member, said second insulating supporter serving to support the optical fibers in such a manner that these optical fibers are inserted in plural through-holes formed in said insulating supporter.

* * * * *